(12) United States Patent
Jhaveri (10) Patent No.: US 12,244,134 B2
(45) Date of Patent: Mar. 4, 2025

(54) DEVICE AND METHOD FOR DETECTING FAULTY ELECTRICAL CIRCUITS WITH FAULT IDENTIFICATION AND ALERT SYSTEM

(71) Applicant: Tejas Kamlesh Jhaveri, Mumbai (IN)

(72) Inventor: Tejas Kamlesh Jhaveri, Mumbai (IN)

( * ) Notice: Subject to any disclaimer, the term of this patent is extended or adjusted under 35 U.S.C. 154(b) by 191 days.

(21) Appl. No.: 17/612,217

(22) PCT Filed: Feb. 10, 2020

(86) PCT No.: PCT/IN2020/050131
§ 371 (c)(1),
(2) Date: Nov. 18, 2021

(87) PCT Pub. No.: WO2020/240576
PCT Pub. Date: Dec. 3, 2020

(65) Prior Publication Data
US 2022/0224101 A1   Jul. 14, 2022

(30) Foreign Application Priority Data
May 28, 2019  (IN) .............................. 201941021131

(51) Int. Cl.
*H02H 3/10*      (2006.01)
*G01R 31/52*    (2020.01)
(Continued)

(52) U.S. Cl.
CPC .............. *H02H 3/10* (2013.01); *G01R 31/52* (2020.01); *G08B 21/185* (2013.01); *H02H 1/0007* (2013.01)

(58) Field of Classification Search
CPC ........ H02H 3/10; H02H 1/0007; G01R 31/52; G08B 21/185
See application file for complete search history.

(56) References Cited

U.S. PATENT DOCUMENTS 6,292,717 B1 * 9/2001 Alexander ......... G01R 19/2513
700/83
6,496,342 B1    12/2002 Horvath et al.
(Continued)

FOREIGN PATENT DOCUMENTS

| AU | 2014224084 A1 * | 3/2015 | ............ G01R 31/52 |
| FR | 2682232 A1 *    | 4/1993 | ............... H02H 1/06 |
| JP | 347644 B2 *     | 11/2003 | |

OTHER PUBLICATIONS

Jamil, M. et al., "Fault Detection and Classification in Electrical Power Transmission System Using Artificial Neural Network", SpringerPlus 4, Jul. 9, 2015, pp. 1-13.
(Continued)

*Primary Examiner* — Harry R Behm
(74) *Attorney, Agent, or Firm* — Idea Intellectual Limited; Margaret A. Burke; Sam T. Yip (57) ABSTRACT

The embodiments provide an electrical safety protection device and method for detecting faulty electrical circuits with fault identification, fault classification and alert system wherein the device is installed between the incoming power supply and the electrical appliance, receives incoming power supply through the input switch and is provided to the voltage sense, current sense, high frequency current sense and core balanced transformer components, the output of these sensor components are provided to a filter component and further the filtered voltage values are provided to the microcontroller wherein the microcontroller analyses these received voltage signals, makes calculations and outputs signals to solenoid present in the input switch determining whether to isolate the incoming power supply or not. The solenoid that works as a switch, switches the incoming (Continued)

power supply into ON or OFF state depending upon the voltage values and instructions received and processed by the microcontroller.

12 Claims, 3 Drawing Sheets

(51) Int. Cl.
*G08B 21/18* (2006.01)
*H02H 1/00* (2006.01)

(56) References Cited

U.S. PATENT DOCUMENTS

| | | | |
|---|---|---|---|
| 2010/0324747 A1* | 12/2010 | Lee | H02H 3/33 |
| | | | 361/45 |
| 2015/0168487 A1* | 6/2015 | Parker | H02H 1/0053 |
| | | | 702/58 |
| 2016/0180687 A1* | 6/2016 | Schroeder | H02H 1/0061 |
| | | | 340/638 |
| 2017/0025842 A1 | 1/2017 | Peterson | |
| 2020/0366079 A1* | 11/2020 | Telefus | H01H 33/593 |
| 2022/0163578 A1* | 5/2022 | Marshall | G01R 27/28 |

OTHER PUBLICATIONS

M. S. Sujatha et al., "On-Line Monitoring and Analysis of Faults in Transmission and Distribution Lines Using GSM Technique", Journal of Theoretical and Applied Information Technology, Nov. 30, 2011, vol. 33, No. 2, pp. 258-265.

* cited by examiner

DEVICE AND METHOD FOR DETECTING FAULTY ELECTRICAL CIRCUITS WITH FAULT IDENTIFICATION AND ALERT SYSTEM

A) TECHNICAL FIELD

The present invention generally relates to the field of electrical circuits fault detection device and method. More particularly, the present invention is aimed at providing a device and method, which facilitates in protecting home or industrial appliances against any electrical mishaps or surges due to faulty circuits and components, identifying the problem source for the electrical mishap and providing alerts to the user or the technician regarding the source of the problem or the electrical mishap through any of the available communication means.

B) BACKGROUND OF THE INVENTION

The electrical systems in residential, commercial and industrial applications usually include a panel board for receiving electrical power from a utility source. The received power is then routed through overcurrent protection devices to designated branch circuits or electrical outlets supplying one or more loads. These overcurrent protection devices are typically circuit interrupters such as circuit breakers and fuses which are designed to interrupt the electrical current if the limits of the conductors supplying to the loads are surpassed. Interruption and breaking the circuit reduces the risk of injury or the potential of property damage from a resulting fire.

Circuit breakers are a preferred type of circuit interrupter because a resetting mechanism allows their reuse. Typically, circuit breakers interrupt an electric circuit due to a disconnect or a trip condition such as a current overload or ground fault. The current overload condition results when a current exceeds the continuous rating of the breaker for a time interval determined by the trip current. A ground fault trip condition is created by an imbalance of currents flowing between a line conductor and a neutral conductor which could be caused by a leakage current or an arcing fault to ground.

Arcing faults are commonly defined as current through ionized gas between two ends of a broken conductor or at a faulty contact or connector, between two conductors supplying a load, or between a conductor and ground. However, arcing faults may not cause a conventional circuit breaker to trip. Arcing fault current levels may be reduced by branch or load impedance to a level below the trip curve settings of the circuit breaker. In addition, an arcing fault, which does not contact a grounded conductor or person, will not trip a ground fault protector.

There have been several attempts drawn to identify the faulty electrical lines and electrical circuit installations but eventually none of them provide a full fledge solution in providing the solution for the identified problem. One such patent application WO2008049436A1 titled "Method and device for location of loose connection", in which a microprocessor and at least one detection means is being provided for detecting a high frequency pulse in the current in at least one phase. The detection means comprises a first detector located on the user side and a second detector located on the supply side, as well as a comparing means for delivering a detection signal to the microprocessor based on detector signals from the first detector and the second detector. The microprocessor herein is being programmed to evaluate a number of successive detection signals. However, the above-mentioned patent application fails to provide relevant real-time advices/suggestions and accurate communication to the concerned technician/user through any of the available communication means.

Further, the patent application U.S. Pat. No. 5,250,909A titled "Automatic fault detection in electrical sensing circuits", continuously monitors the operational status of the sensing circuit. Generally open sensors are provided with a resistance across the open circuit contacts to provide a small leakage current. For each sensor, a high and a low comparators are provided. The high comparator is ground seeking and is used to detect closure of open circuit sensors, grounded connections and systems tests. The low comparator detects open circuits or high resistances such as might be caused by broken or loose wires, improperly connected sensors or electrically degraded sensors. The comparators drive logic components, which in turn drive indicators of circuit operational readiness. Unfortunately, the above-mentioned patent document fails to provide relevant real-time advices/suggestions and accurate communication to the concerned technician/user through any of the available communication means.

Therefore, there exist many conditions that may cause electrical surges such as arcing faults, short circuit, neutral loss, over voltage, under voltage, voltage surge, phase loss, voltage harmonics and phase reversals. These faults may damage the appliances and allowing the connected wiring circuits to reach unacceptable temperatures. Adding to this, arcing faults due to faulty circuits or faulty electrical components can also cause fire if combustible materials are in close proximity leading to electrical mishap.

Hence, the existing solutions for electrical safety are inadequate as they are not able to detect all electrical issues. A significant challenge in using these electrical safety devices is due to nuisance tripping (or perceived nuisance tripping). Often time electrical safety devices are not able to identify fault correctly. They trip more often than they should. Even if the electrical safety devices trip correctly, many times it is extremely difficult and time consuming to find the source of the problems. Without adequate tools, it is close to impossible to identify the root cause of the problem and as a result, the electrical safety device is disconnected or bypassed.

Adding to this, even if the source or root cause of the electrical problem is identified, providing timely and real time alerts to the users and concerned technicians has always remained as a challenge. Hence, in the view of the foregoing, there exist a need to provide a device and method, which facilitates in identifying faulty circuits, faulty electrical components and provide automated protection to home and industrial appliances against any electrical mishaps caused due to electrical faults. Further, there also exist a need to provide a device and method, which facilitates in providing real-time or timely alerts to the end-users or other related technicians, indicating the source of the problem, severity of the electrical faults and communicating the same with advices/suggestions with the end-user or to the concerned technician through any of the onboard communication means.

The above-mentioned shortcomings, disadvantages and problems are addressed herein, which will be understood by reading the following specification.

C) OBJECTS OF THE INVENTION

The primary object of the present invention is to provide an electrical safety device and method for identification of faulty electrical circuits or electrical installations, electrical components and outlets with real-time alerts/suggestion or advice related to the identified fault being communicated to the end-user and other technicians depending on the severity about the fault.

The other object of the present invention is to provide an electrical safety device and method that identifies electrical signatures leading to electrical faults that are not only harmful to individuals and assets but can also lead to fires.

Another object of the present invention is to provide an electrical safety device and method, which is connected as a single device for multiple circuits connected within a distribution board.

Another object of the present invention is to provide an electrical safety device and method that can determine the cause and location of an electrical fault hence making it easier to fix the electrical fault Another object of the present invention is to provide an electrical safety device and method that provide early indicators for the critical faults and provide advice or suggestions to the end-user or to the concerned technician on the corrective steps to be followed.

Another object of the present invention is to provide an electrical safety device and method for identification of faulty electrical circuits or electrical installations and outlets at the early stages of operation such that corrective measures can be taken to rectify the problem by classifying the identified fault into various levels and providing the information/advice or suggestion about the fault to one or more end-users and concerned technicians.

Another object of the present invention is to provide an electrical safety device and method for identification of faulty electrical circuits or electrical installations and outlets and provide real-time alerts/advices or suggestions through any of the wired or wireless means to the end-user and related technicians describing the fault and suggested solution or advice for the identified fault.

Yet another object of the present invention is to provide an electrical safety device and method that employ various pattern matching method to match the patterns of different electrical loads and identify the loads that are operational at a given time instance thereby identifying faulty electrical circuits or electrical installations and outlets.

These and other aspects of the embodiments herein will be better appreciated and understood when considered in conjunction with the following description and the accompanying drawings. It should be understood, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

Other benefits and advantages of the present disclosure will be appreciated from the following detailed description.

D) SUMMARY OF THE INVENTION

The embodiments of the present invention provide an electrical safety protection device and method for detecting faulty electrical circuits with fault identification and alert system, the device comprising of at least one or more incoming switches, at least one voltage sensing component, a current sensing component, at least one high frequency current sensing component, at least one core balanced transformer component, at least one voltage filter component, at least one microcontroller, a powering means to power the entire device for normal operation, a display means to display various parameters related to received voltage, statues with current values and one or more communication components.

According to an embodiment of the present invention, the power supply is received by the electrical safety protection device through one or more incoming switches, which in turn the received power supply is provided to the voltage sensing, current sensing, high frequency current sensing and core balance transformer components. Further, the power output from the voltage sensing, current sensing, frequency sensing and core balance transformer is fed into the filtering component. The Low frequency current sense circuit is used to convert the low frequency input current signal to a low voltage signal that can be measured by the microcontroller. Additionally, the power from the current sensing component is provided to the high frequency current sense component and further to the core-balanced transformer and to the output.

The power is routed to the microcontroller component; thereby the microcontroller component monitors the incoming signals that are received from the filter circuit and makes calculations and outputs signals to solenoid present in the incoming switch deciding weather to isolate the incoming power supply or not. The microcontroller also provides various data to be displayed onto the display component and the similarly the communication data is provided to communication component. The data received by the communication component is transmitted to the end user or to the related technicians through any of the communication means indicating the status of the power supply, faulty power lines and other such information.

According to an embodiment of the present invention, the microcontroller component employs a pattern matching method to match the patterns of different electrical loads and identify the loads that are operational at a given time instance of time. These pattern-matching methods are pre-programmed or programmed over the air and fed into the memory of the microcontroller. The pattern matching methods used herein for identification of fault includes methods like DCT, Taylor's, neural network pattern detectors and other learning algorithms, which intake one or more electrical parameters and the pattern matching method in the device analyses weights and functions based on these data.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

E) BRIEF DESCRIPTION OF THE DRAWINGS

Exemplary embodiments of a system and method are shown in the accompanying drawings. The other objects, features, and advantages will occur to those skilled in the art from the following description of the preferred embodiment and the accompanying drawings in which:

FIG. 1 illustrates the component diagram of an electrical safety protection device indicating various components of the system and their interconnections with the other sub-components according to the embodiment of the invention.

FIG. 2 illustrates the system flow diagram illustrating the series of steps starting from installing the electrical safety protection device at the target location and continuously monitoring the incoming electrical signals for any faults, according to the embodiment of the invention.

FIG. 3 illustrates the installation and wiring diagram of the electrical safety protection device at the target location according to the embodiment of the invention.

Although the specific features of the present invention are shown in some drawings and not in others. This is done for convenience only, as each feature may be combined with any or all of the other features in accordance with the present invention.

F) DETAILED DESCRIPTION OF THE INVENTION

In the following detailed description, reference is made to the accompanying drawings that form a part hereof, and in which the specific embodiments that may be practiced is shown by way of illustration. These embodiments are described in sufficient detail to enable those skilled in the art to practice the embodiments and it is to be understood that the logical, mechanical and other changes may be made without departing from the scope of the embodiments. The following detailed description is therefore not to be taken in a limiting sense.

The embodiments of the present invention provides an electrical safety protection device for detecting faulty electrical circuits with fault location identification and alert system. The existing solutions for electrical safety protection systems are inadequate as they are not able to detect much or all of the electrical issues. A significant challenge in using these electrical safety devices is due to nuisance tripping (or perceived nuisance tripping). The most common reason for nuisance tripping is a transient current to ground, which is above the threshold of the RCD (Residual Current Devices) and subsequently causes the RCD to trip. Often time RCD devices are not able to identify fault correctly and they trip more often than they should. Even if the electrical safety devices RCD devices trip correctly it is many a times extremely difficult and time consuming to find the source of the problems. Without adequate tools, it is close to impossible to identify the root cause of the electrical problem and as a result, the electrical safety device is disconnected or bypassed.

In an attempt to address the above-mentioned problem, the proposed solution is to have electrical safety and protection device connected to each circuit either in the distribution board or at each individual outlet. These patterns of electrical safety and protection device installations enables the end-users or the technicians to monitor the electrical lines and electrical appliances for normal and safe operation at a micro level.

In the proposed invention, the electrical safety and protection device is primarily installed at the domestic electricity receiving distribution panel where we generally receive incoming power lines from the public electrical junctions/feeds. The electrical safety and protection device intakes power lines from the energy meter and distributes the power to the domestic appliances through the electrical safety and protection device. This enables the electrical safety and protection device to check the received electrical signatures, if they are safe to be relayed to the domestic or industrial appliances for normal operation. It is to be observed that the electrical safety and protection device receives incoming power lines through incoming switches, which comprises of but not limited to an input switch, an arc quenching, a bimetallic strip and a solenoid.

The electrical safety and protection device identifies the electrical signatures leading to electrical faults that are not only harmful to individuals and assets but can also lead to fires and other electrical mishaps. Moreover, the electrical safety and protection device provides a solution that is connected as a single device for monitoring multiple circuits connected within a distribution board. Further, the electrical safety and protection device can determine the cause and location of an electrical fault hence making it easier to fix the electrical fault. Another aspect of electrical safety and protection device is that the device is able and configured to give early indicators for the critical faults and advice on the corrective steps.

According to the embodiment, the electrical safety and protection device comprises of at least one or more incoming switches, a voltage sensing component, a current sensing component, a high frequency current sensing component, a core balanced transformer component, a voltage filter component, a microcontroller, a powering means to power the entire device for normal operation, a display means to display various parameters related to received voltage or current and one or more communication components.

Wherein, one or more incoming switches receive the incoming power supply, which in turn supplies the power to the voltage sensing, current sensing, high frequency current sensing and core balance transformer. The power signals sensed by the voltage sensing component, current sensing component, high frequency current sensing component and core balance transformer component is fed into the filtering component. The filtering component allows passing the DC component of the load and blocks the AC component of the rectifier output. Thus, the output of the filter circuit will be a steady DC voltage whose values are readable by semiconductor components such as microcontrollers.

Further, the DC component or the DC voltage from the filter is fed into the microcontroller component; wherein the microcontroller component monitors and analyses the received voltage from the filter circuit pertaining to the input power supply received by the electrical safety and protection device. The microcontroller on receiving the input voltages from the filter component, the microcontroller converts the received analog voltage into digital signals. These digital signals are processed with a pre-coded and an inbuilt software method in the microcontroller, thereby making necessary calculations in deciding to cut off the incoming power supply or not. If the electrical safety and protection device senses the incoming power supply to be at dangerous levels, the microcontroller on the electrical safety and protection device outputs trip/switch off signals to the solenoid present in the incoming switch to isolate and cut off the incoming power supply.

The microcontroller further provides various data to be displayed onto the display component. These data include such as but not limited to information regarding the occurred fault, status of the power supply, faulty power lines, location of the fault, time and date stamp of the occurred fault, suggestion or advice for the identified fault and concerned technician to be contacted with the relevant technician's contact information. These displayed data is also transmitted or communicated to the end-user through any of the available wired or wireless means of communication configured in the installed electrical safety and protection device.

The wired communication means can be such as but not limited to communicating data through an active internet connection, LAN/Ethernet based communication or a dialup phone line communication. The wireless communication means include such as but not limited to GSM/GPRS based communication, wireless internet communication, Bluetooth based communication, NFC communication, data communication over a Wi-Fi, Modbus communication and long-range communications devices.

It is to be understood that the electrical safety and protection device is also capable of housing a GPS (Global Positioning Device) in order to share the location with the technicians and other end-users. Further, the microcontroller component report the type and the geospatial location of the fault to a predefined set of individuals through one or more communications means such as but not limited to SMS, email or cloud based communications. The reference parameters for the method present in the device, which identifies faulty electrical circuits with fault identification and alert system, can be re-programmed over the air through the any of the available communication means to provide the parameters and other settings to the electrical safety and protection device.

Further, the method present in the microcontroller is capable of automatically registering a complaint regarding the occurred fault, by communicating to any of the external complaint computer servers through any of the available communication means and communication components.

The microcontroller component employs a pattern matching method to match the patterns of received different electrical loads and identify the loads that are operational at a given instance of time. The pattern matching methods are used during the time of electrical faults identification to match any variations in the electrical parameters and/or transformations. The pattern matching methods employed herein includes like but not limited to DCT, Taylor's, neural network pattern detectors and other learning algorithms, which are performed on the received electrical parameters such that the device learns weights and functions based on these received data.

The pattern matching is performed on geographical data, types of loads, type of installation as well as normal patterns in case of clusters of loads with similar patterns. Further, the microcontroller comprises of an embedded method that identifies and interprets electrical fault signatures in real time corresponding to electrical failure, to create early warning alarms based on the threshold values and to isolate the incoming power supply based on one or more defined threshold values or data. According to the embodiment, the solenoid is turned into ON/OFF state depending on the received power supply from the incoming switches. The source of the electrical fault is identified by monitoring and comparing the change in parameters such as KW, KWH, KVA, PF and other such harmonics. Hence, the device can identify any deviations in the electrical parameters and provide an early warning for preventive maintenance.

Further to this, an additional battery and a button will be provided for a low voltage DC power to activate the system even when the incomer is switched off. This button is used to power on the device and report the history of electrical faults and existing electrical faults on the display screen while the incomer power is switched off.

Figure 01:
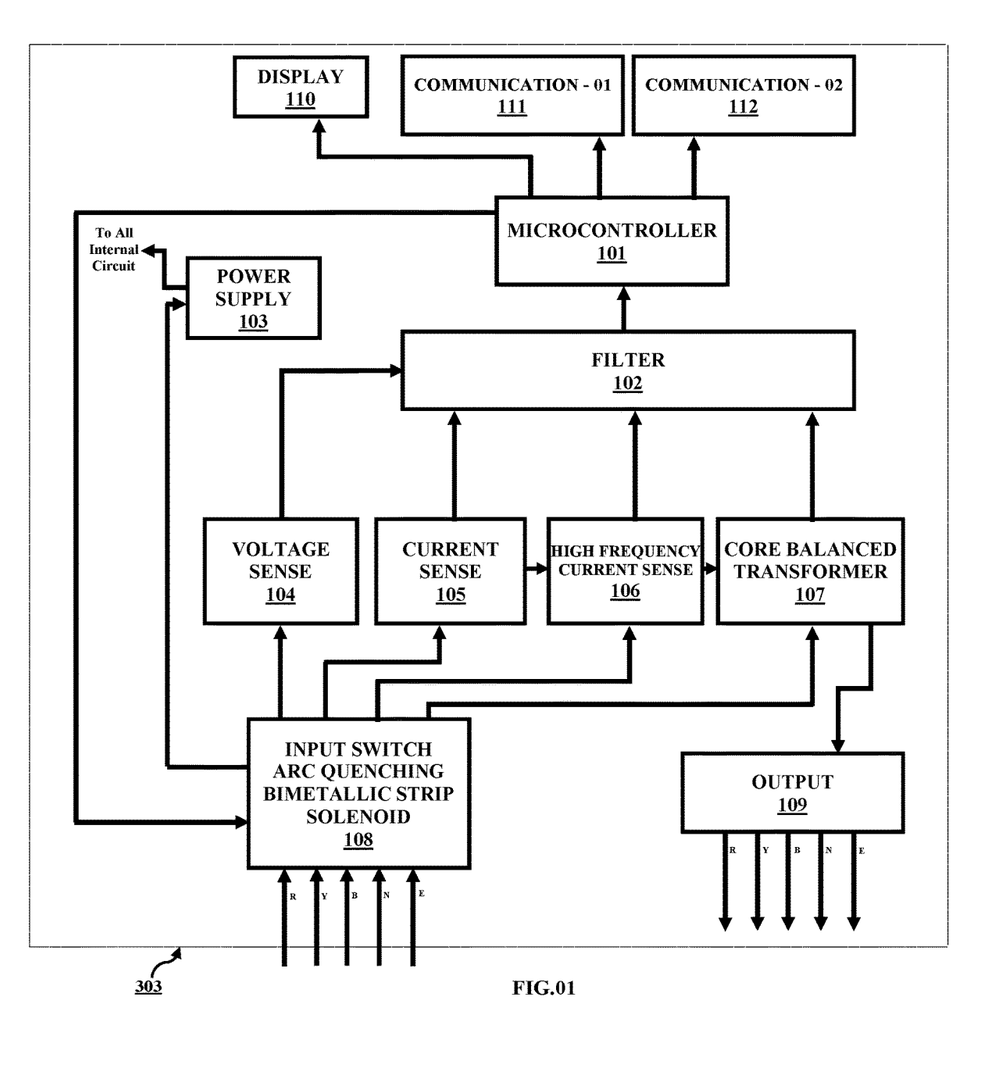

FIG. 1 illustrates the component diagram of an electrical safety protection device indicating various components of the system and their interconnections with the other sub-components according to the embodiment of the invention. Accordingly, the electrical safety and protection device 303 comprises of, at least one or more incoming switches 108, at least one voltage sensing component 104, a current sensing component 105, at least one high frequency current sensing component 106, at least one core balanced transformer component 107, at least one voltage filter component 102, at least one microcontroller 101, a powering means to power the entire device for normal operation 103, a display means 110 to display various parameters related to received voltage or current and one or more communication components 111 and 112 for communicating and receiving data from external devices.

The incoming switches 108 receives the input power supply from the public electrical feeds through an energy meter and in turn is fed to the voltage sensing component 104, current sensing component 105, high frequency current sensing component 106 and core balance transformer component 107, present on the electrical safety and protection device 303. The low frequency current sense circuit 105 is used to convert the low frequency input current signal to a low voltage signal that can be measured by the microcontroller 101. Typically, current transducers are used here and are tuned to accurately measure the low frequency signals.

The high frequency current sense circuit 106 is used to amplify the high frequency input current signal to a voltage signal so that it can be measured by the microcontroller 101. Further, a core balanced transformer 107 is a circuit that is used to identify the earth leakage currents observed in the circuits. These sensors (104, 105, 106 and 107) provide the sensed power inputs to the filtering component 102 wherein the filtering circuits 102 are used to condition and convert the signals received from the voltage sense component 104, low frequency current sense component 105, high frequency current sense component 106 and core balanced transformers 107 to improve the signal to noise ratio and bring it at a voltage level that is easily measured by the Analog to digital converters present in the microcontrollers 101.

The microcontroller component 101 monitors/analyses the received voltage signals, which pertains to the incoming signals to the electrical safety and protection device 303. The microcontroller 101 takes input voltage signals from the filtering circuit 102, makes calculations and outputs signals to solenoid present in the incoming switch 108 determining weather to isolate the incoming power supply or not. The solenoid that works as a switch, switches the incoming power supply into ON or OFF state depending upon the voltage values and instructions received and processed by the microcontroller 101.

The microcontroller 101 also provides various data and information to be displayed onto the display component 110 and the communication data is provided to communication component 111 and 112 which are to be transmitted to one or more external devices. The display means 110, which is at least a LCD display component, is used to display data such as but not limited to metering data, details of warnings and faults; to the end-user or to other concerned technicians. The data received by the communication component 111 and 112 is transmitted to the end user or to the concerned technicians or to the external devices such as servers that store data on the cloud, through any of the wired or wireless means of communication where the transmitted data indicates and includes information relating to such as but not limited to status of the power supply, faulty power lines, location of the fault, severity of the fault and other such information.

Further, the pre-programmed method in the microcontroller 101 can be re-programmed in a manner such that the electrical faults can be categorized into various levels with fault severity, suggested technician to be contacted and the end-users to be informed about various levels of electrical faults with advices/suggestions about the fault, can also programmed and fed into device 303. The persons (end-users and technicians) to be informed for various levels and severity of electrical faults and their respective communication details such as but not limited to phone number and email address can be programmed and stored into the device's 303 memory. In continuation, the device is also capable of locating the location of the electrical fault and its severity with possible suggested and recommended measures, which are to be communicated to the end-users and the relevant technicians.

As an example, any problem with the electrical components or electrical wiring, the owner/end-user of the premises with the associated electrical technician gets an alert message with the severity of the problem and its location with possible solutions/advices/suggestions for the problem. Similarly, if the problem or fault is related to the incoming or the input electricity to the premises, the device 303 sends the relevant signals to the solenoid to shut the incoming power supply and the device 303 transmits the message relating to the fault to the owner/end-user of the premises with the associated electrical lineman wherein the transmitted message includes but not limited to the severity of the problem, its location with possible solutions/advices/suggestions. Hence, this eases the problem where the end-user calling the irrelevant persons for rectifying the problems. Hence, this automation of sending messages to the concerned person helps in communicating the relevant problem to relevant person in real time.

Further the incoming switches 108 comprise input switch which are one or more mechanical and electro-mechanical switches that are used to turn ON or OFF the device. While, the device tries to break a fault signal, high currents known as arc are observed. The arc quenching device in the incoming switches 108 is used to control and quench the arc so that it does not create damage to other components in the system. The bimetallic strip is used to sense high currents and isolate the incoming switch. Further, a solenoid is an electromechanical device, wherein an electrical pulse is given to trigger a mechanical motion that will in turn trigger to isolate the incomer switch 108.

Finally, the device includes a AC to DC converter power supply 103 which is used to power all the internal circuits of the device for normal functioning.

Figure 02:
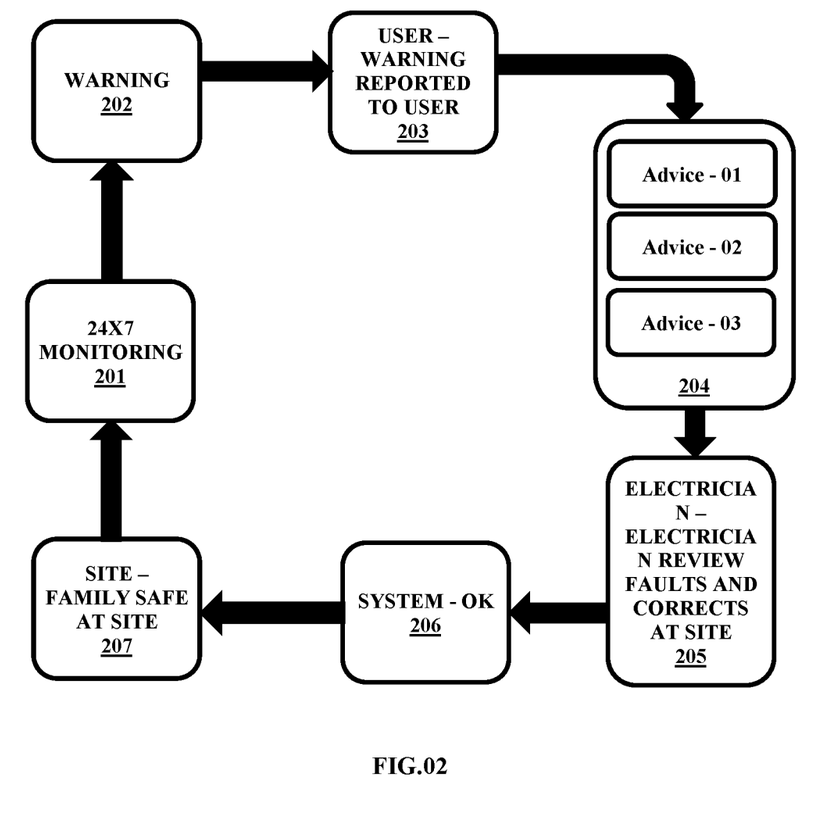

FIG. 2 illustrates the system flow diagram illustrating the series of steps starting from installing the electrical safety protection device at the target location and continuously monitoring the incoming electrical signals for any faults, according to the embodiment of the invention. Accordingly, the device for monitoring and detecting faulty electrical circuits with fault identification and alert system is installed in the power panel 201. The installed device monitors the incoming and outgoing power connections 202 and if any fault is located in any of the wiring systems (internal and external), power appliances or power components, a immediate alert is sent 203 through any of the available communication channels to the end-users/the relevant technicians/or to an external computing devices—indicating the source of the problem, severity of the problem and possible suggested solutions/Advices 204. The display panel in the electrical safety and protection device 303 displays information relevant to the fault and the point of electrical installation the fault is detected is also displayed. The electrician or the specified designated technical persons addresses the issue and resets the information 205. Once the device is reset, the device starts working normally and continues monitors the circuits 206 ensuring the safety of the users and the connected electrical components 207.

Figure 03:
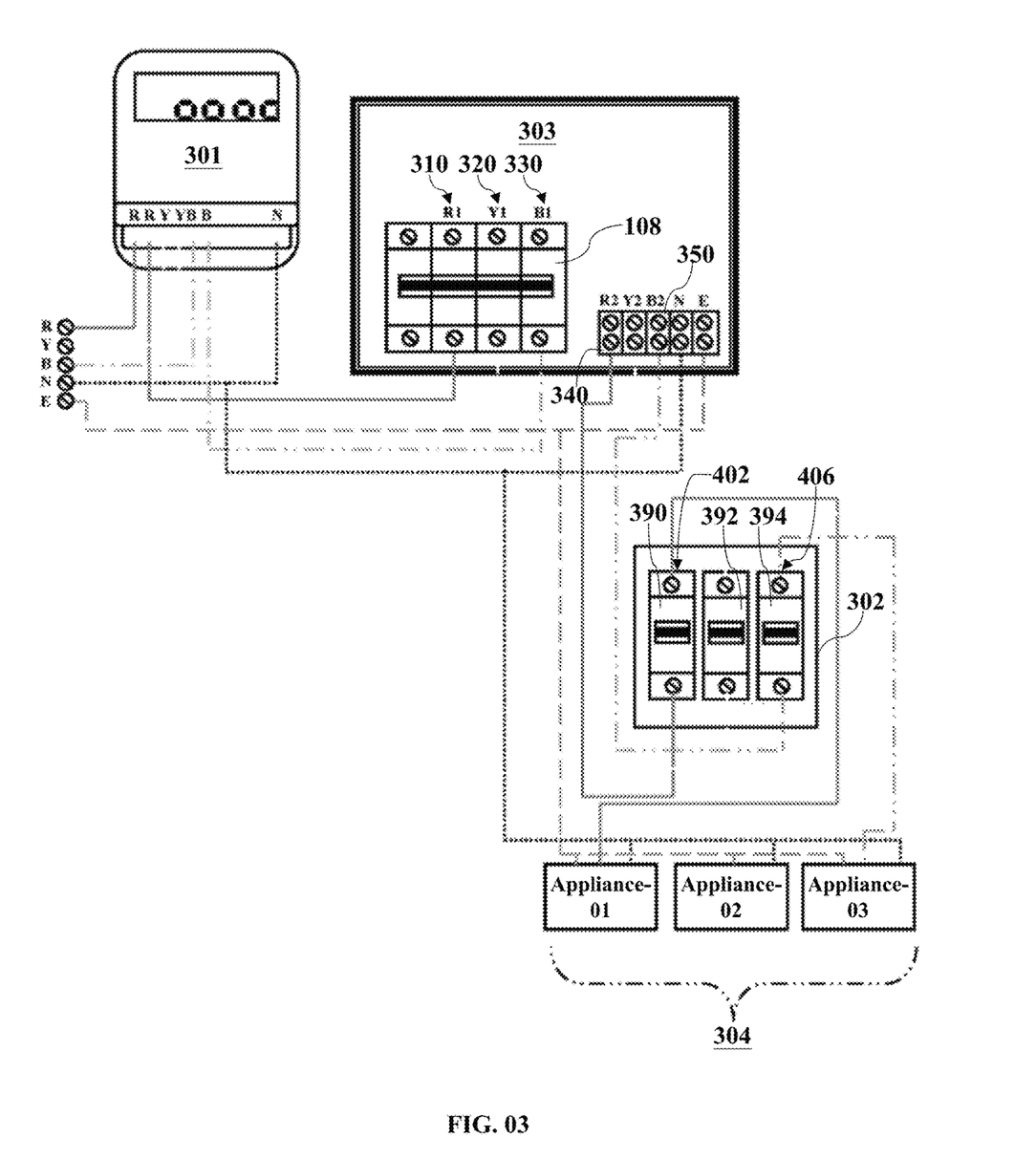

FIG. 3 illustrates the installation and wiring diagram of the electrical safety protection device at the target location according to the embodiment of the invention. Accordingly, the electrical safety and protection device 303 is installed between the incoming power supply through the energy meter 301 and the distribution box 303. The incoming power lines from the public power utility is drawn to the energy meter 301 and then routed to the electrical safety and protection device 302. The electrical safety and protection device 303 is positioned such that the incoming power lines from the energy meter 301 has to go through the electrical safety and protection device 303 and then reach the distribution box 302 for it to be supplied for one or more appliances 304. In case, the electrical safety and protection device 303 senses any fluctuation in the incoming power signals/senses any wiring issues or identifies any fault in the connected electrical components, the electrical safety and protection device 302 sends out a signal to the solenoid present in the input switch 108 to trip OFF the incoming power supply, thereby ensuring no further damages to the connected appliances 304 in the circuit. The electrical safety and protection device 303 uses a pattern matching method present in the microcontroller and in a local server with the one in the cloud server, to match the patterns of received different electrical loads and identify the loads that are operational at a given instance of time.

Hence, the introduction of the electrical safety and protection device 303 ensures that the incoming power lines are scanned for any fluctuations and connected circuitries are monitored continuously for any fault thereby protecting the connected appliances.

For the system shown in FIG. 3, 3-phase inputs R1, Y1, and B1 are depicted as 310, 320, and 330 in switch 108 electrical safety and protection device 303 (note that in single phase, only R1 and B1 are used as seen in FIG. 3). Plural outputs 340 and 350 may be connected from R2 and B2 to distribution box 302. As seen in FIG. 3, distribution box 302 includes breakers 390, 392, and 394; therefore, distribution box 302 is a breaker panel. In breaker panel 302, output 340 from electrical safety and protection device 303 is connected to breaker 390 and output 350 is connected to breaker 394. Breaker 390 has an output 402 connected to Appliance 01 and breaker 394 has an output 406 connected to Appliance 03. Therefore, electrical safety and protection device 303 is positioned between energy meter 301 and breaker panel 302. Breaker panel 302 is connected to electrical appliances 304.

The foregoing description of the specific embodiments will so fully reveal the general nature of the embodiments herein that others can, by applying current knowledge, readily modifying and/or adapting for various applications, such specific embodiments, without departing from the generic concept, and, therefore, such adaptations and modifications should and are intended to be comprehended within the meaning and range of equivalents of the disclosed embodiments.

It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

The various embodiments of the present invention provide an electrical safety and protection device for detecting faulty electrical circuits with fault identification and alert system. The electrical safety and protection device will continuously monitor the incoming electricity and other connected circuits, do early diagnosis of electrical faults and warns against all 20 or more known electrical problems thus preventing electrical fires and other electrical mishaps.

The electrical safety protection device and method described herein provides protection from random equipment failures, electrical fires, humming sound, overcharging batteries and overheating appliances.

The electrical safety protection device and method described herein constantly monitors the incoming power supply and search for any electrical circuit failure signatures that are identified and addressed at minor stages before these problem reach critical levels. Thus enabling improved preventive maintenance and higher reliability.

The electrical safety protection device and method described herein provides a solution that is able to self-diagnose the incoming power lines, the connected circuits and components and provide protection from critical electrical faults with high risk coverage by providing real time alerts and advices about fire protection, shock protection and equipment protection.

The electrical safety protection device and method described herein provides real-time monitoring of the incoming power supply and if a fault is identified, real time messages relating to fault, location of the fault and other such related data is transmitted through any of the available communication means to the end-user or to the concerned technicians.

The electrical safety protection device and method described herein uses a pattern matching method to match the patterns of received different electrical loads and identify the loads that are operational at a given instance of time.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments.

It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

Certain exemplary embodiments of the disclosure may be described. Of course, the embodiments may be modified in form and content, and are not exhaustive, i.e., additional aspects of the disclosure, as well as additional embodiments, will be understood and may be set forth in view of the description herein. Further, while the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present application has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Therefore, the application, in its broader aspects, is not limited to the specific details, the representative apparatus and method, and illustrative examples shown and described. Accordingly, departures may be made from such details without departing from the spirit or scope of the applicant's general inventive concept.

I claim:

1. An electrical safety protection system for determining electrical fault patterns, in order to prevent critical electrical fires, and providing real-time feedback concerning fault condition, and status of incoming power supply as well as faulty wiring and appliances in the covered distribution network, comprising:

an electrical safety protection apparatus positioned between a power meter and a breaker panel, the breaker panel being connected between the electrical safety protection apparatus and one or more electrical appliances, the electrical safety protection apparatus for monitoring both incoming power characteristics from a public electrical power supply and internal faults within wiring systems, power appliances, or power components, the electrical safety protection apparatus comprising:

one or more incoming switches including a solenoid for receiving incoming electrical power from the power meter;

a voltage sensing component for sensing the voltage of the incoming electrical power;

a current sensing component for sensing the current of the incoming electrical power;

a high frequency current sensing component for sensing the current of the incoming electrical power;

a core balanced transformer component;

a filter receiving output signals from the voltage sensing component, the current sensing component, the high frequency current sensing component and the core balanced transformer component and outputting a filtered output signal;

a microcontroller receiving the filtered output signal and analyzing the filtered signal, the microcontroller outputting a signal to the solenoid to isolate the incoming electrical power when the incoming electrical power is determined to be faulty based on the filtered signal, the microcontroller further employing pattern matching to match patterns of received different electrical loads and identify the loads that are operational at a given instance of time thereby identifying faulty electrical circuits or electrical installations and outlets wherein the pattern matching uses learning algorithms, which are performed on received electrical parameters in order to learn weights and functions based on received electrical parameters;

a display communicating with the microcontroller;

one or more communication components receiving data from the microcontroller and sending wired or wireless messages to a cloud server regarding an occurred fault, a status of an incoming electrical power supply, fault locations, or faulty power lines and for matching patterns of different electrical loads to identify loads that are operational at a given time instance thereby identifying faulty electrical circuits or electrical installations and outlets and issuing alerts to a user.

2. The electrical safety protection system according to claim 1, wherein the microcontroller performs the pattern matching based on geographical data, types of loads, type of installation and normal patterns in case of clusters of loads with similar patterns.

3. The electrical safety protection system according to claim 1, wherein the solenoid is turned into an ON/OFF state depending on the input power supply received onto the one or more incoming switches.

4. The electrical safety protection system according to claim 1, wherein the microcontroller includes an embedded method that identifies electrical fault signatures in real time corresponding to electrical failure and creates various variable warning alarms based on one or more threshold values, severity of the faults and decides whether to isolate the incoming power supply based on the one or more threshold values.

5. The electrical safety protection system according to claim 1, wherein the one or more communication components are selected from a group consisting of components that facilitate long range and short-range data and voice signal transmission for safety-related communications, and the components include at least one of a wired component and a wireless component.

6. The electrical safety protection system according to claim 1, wherein the one or more communication channels are configured to enable real-time safety monitoring and control, and the one or more communication channels includes at least one of Wi-Fi communication, GSM communication, Modbus communication and an Ethernet communication means.

7. The electrical safety protection system according to claim 1, wherein the microcontroller reports a type and a geospatial location of the electrical fault and severity of the electrical fault to a predefined set of individuals and related technicians through one or more communications means including voice messages, short message services (SMS), email or cloud based communications.

8. The electrical safety protection system according to claim 1, wherein a source of the electrical fault is identified by monitoring and comparing the change in one or more parameters including kilowatt hour (kWh), a kilowatt (kW) and kilovolt ampere (kVA), Power Factor (PF) and harmonics.

9. The electrical safety protection system according to claim 1, wherein the system identifies any deviations and fluctuations in electrical parameters, connected electrical components, electrical appliances and provides a variable warning to one or more categories of people depending on the severity of the electrical fault for preventive maintenance.

10. The electrical safety protection system according to claim 1, wherein the system identifies faulty electrical circuits through a fault identification and alert unit, adapted to be configured over the air through the one or more communication components.

11. The electrical safety protection system according to claim 1, wherein the fault identification and alert unit is further configured to categorize the electrical faults into various levels depending on fault severity such that end-users and related or concerned technicians are informed of the various levels of the electrical faults.

12. The electrical safety protection system according to claim 1, further comprising a communication unit pre-configured with communication details of the one or more end users and technicians for communicating the electrical level faults and the severity of electrical faults, on detecting an electrical fault in the input power supply.

* * * * *